United States Patent [19]
Kim et al.

[11] Patent Number: 6,087,851
[45] Date of Patent: Jul. 11, 2000

[54] METHOD AND APPARATUS FOR CONFIGURING A SEMICONDUCTOR DEVICE FOR COMPATIBILITY WITH MULTIPLE LOGIC INTERFACES

[75] Inventors: Chi-wook Kim, Suwon; Kyung-woo Kang, Kyungki-do, both of Rep. of Korea

[73] Assignee: Samsung Electronics, Co., Ltd., Suwon, Rep. of Korea

[21] Appl. No.: 09/070,894

[22] Filed: Apr. 30, 1998

[30] Foreign Application Priority Data

Apr. 30, 1997 [KR] Rep. of Korea .................. 97-16807

[51] Int. Cl.[7] ............................................. H03K 19/0175
[52] U.S. Cl. .......................... 326/63; 326/37; 326/62
[58] Field of Search ................... 326/31, 33, 37, 326/62, 63, 80, 82, 86; 395/500

[56] References Cited

U.S. PATENT DOCUMENTS 5,530,379  6/1996  Konishi et al. ....................... 326/68
5,804,985  9/1998  Shieh et al. ........................ 326/39

*Primary Examiner*—Michael Tokar
*Assistant Examiner*—Anh Tran
*Attorney, Agent, or Firm*—Marger Johnson & McCollom, P.C.

[57] ABSTRACT

A semiconductor device can be configured for compatibility with different system level interfaces, e.g., LVTTL or SSTL, after assembly, thereby eliminating the need for bonding options and reducing the cost of manufacturing the device. The device includes an interface dependent circuit that operates with a selected interface in response to one or more interface enable signals. Several alternative embodiments include interface control circuits and mode register circuits for generating the interface enable signals responsive to a row address and control signals such as RAS, CAS, WE, and CS. Some embodiments also include a switching network that allows an input buffer to use an internally generated reference voltage for one interface and an externally applied reference voltage for a second interface.

29 Claims, 12 Drawing Sheets

METHOD AND APPARATUS FOR CONFIGURING A SEMICONDUCTOR DEVICE FOR COMPATIBILITY WITH MULTIPLE LOGIC INTERFACES

This application corresponds to Korean patent application No. 97-16807 filed Apr. 30, 1997 in the name of Samsung Electronics Co., Ltd., which is herein incorporated by reference for all purposes.

BACKGROUND OF THE INVENTION

1. Field of the Invention

This invention relates generally to semiconductor devices, and more particularly, to semiconductor devices that are compatible with multiple logic interfaces.

2. Description of the Related Art

Semiconductor devices having a plurality of memory devices and a plurality of array groups for the memory devices are interfaced to other components through more than one type of logic interface. For example, a synchronous dynamic random access memory device has two types of interfaces: low voltage transistor transistor logic (LVTTL) and stub series terminated transceiver logic (SSTL). The LVTTL is used for conventional dynamic random access memory, and the SSTL is used for synchronous dynamic random access memory. Differences between logic levels for the LVTTL and the SSTL interfaces are shown in Table 1.

TABLE 1

| items | LVTTL | SSTL |
| --- | --- | --- |
| Vih/Vil | 2.0V/0.8V | (VREF + 0.2)V/(VREF − 0.2)V |
| VOH/VOL | 2.4V/0.4V | (Vtt + 0.8)V/(Vtt − 0.8)V |
| AC measurement point | 1.4V | Vtt |
| VREF | no application | application from system |

Some of the differences between LVTTL and SSTL interfaces will now be described in more detail. First, with SSTL, the input buffers utilize an external reference voltage VREF, but with LVTTL, the input buffers use an internally generated reference voltage. Second, LVTTL and SSTL have different input voltage swings. That is, Vih/Vil for LVTTL are 2.0V/0.8V, while Vih/Vil for SSTL are (VREF+0.2)V/(VREF−0.2)V. Thus, the input voltage swing is narrower for SSTL. Third, LVTTL and SSTL have different output voltage swings. VOH/VOL for LVTTL are 2.4V/0.4V DC, and the AC measurement point for the AC voltage level is 1.4V. However, VOH/VOL for SSTL is (Vtt+0.8)V/(Vtt−0.8)V at a DC voltage level based on a terminal voltage (Vtt), and the AC measurement point of the AC voltage level is the terminal voltage (Vtt).

In a synchronous semiconductor memory device, the SSTL interface is designed differently from the LVTTL in order to improve the performance thereof.

FIG. 1 is a block diagram of a conventional semiconductor device. Referring to FIG. 1, the conventional chip circuit is designed to be compatible with both LVTTL and SSTL interfaces. The device is configured for operation with either an LVTTL interface or an SSTL interface by using a hardwired bonding option during assembly of the device.

If the device is to be configured for operation with an SSTL interface, power/ground port 100 is connected to an SSTL pad 110 by a bonding wire during an assembly step so that an SSTL enable signal (PSSTL), which is generated by SSTL enable circuit 120, is activated (driven to a "thigh" logic level). The SSTL enable signal PSSTL causes SSTL dependent circuit 130 to operate so as to be compatible with an SSTL interface. Also, since the LVTTL interface uses the reference voltage generated by an internal reference voltage generator 170, and the SSTL interface uses an externally generated reference voltage that is applied via a reference voltage pad 140, the reference voltage pad 140 is bonded to an external pin when the device is configured for compatibility with an SSTL interface, and the SSTL enable signal causes the reference voltage control circuit 160 to block the internally generated reference voltage from the input buffer 150.

In contrast, when the device is configured for compatibility with an LVTTL interface, the power/ground port 100 is not bonded to the SSTL pad, and the VREF generated by the reference voltage generator 170 is applied to the input buffer 150 through reference voltage control circuit 160.

In the conventional semiconductor device shown in FIG. 1, a determination must be made during assembly as to which type of interface the device is to be configured for. Thus, the cost of manufacturing and distributing the device is increased if the respective market demands for the differently configured devices are not predicted accurately because devices configured for different interfaces are not compatible.

Accordingly, a need remains for an improved scheme for configuring semiconductor devices for compatibility with different logic interfaces.

SUMMARY OF THE INVENTION

Therefore, it is an object of the present invention to reduce the cost of manufacturing semiconductor devices that are compatible with multiple interfaces.

Another object of the present invention is to provide a semiconductor device that can be configured for compatibility with different interfaces after the device is assembled.

To accomplish these and other objects, a semiconductor device constructed in accordance with the present invention can be configured for compatibility with different system level interfaces, e.g., LVTTL or SSTL, after assembly, thereby eliminating the need for bonding options and reducing the cost of manufacturing the device. The device includes an interface dependent circuit that operates with a selected interface in response to one or more interface enable signals. Several alternative embodiments include interface control circuits and mode register circuits for generating the interface enable signals responsive to a row address and control signals such as RAS, CAS, WE, and CS. Some embodiments also include a switching network that allows an input buffer to use an internally generated reference voltage for one interface and an externally applied reference voltage for a second interface.

One aspect of the present invention is a semiconductor device comprising: an interface control circuit for activating one of a plurality of interface enable signals responsive to at least one input signal for selecting an interface mode; and an interface dependent circuit coupled to the interface control circuit for receiving the plurality of interface enable signals and operating in a selected interface mode responsive to the plurality of interface enable signals, whereby the semiconductor device is compatible with a plurality of system level interfaces.

Another aspect of the present invention is a semiconductor device comprising: a mode register setting circuit for activating one of a plurality of interface enable signals responsive to an input address and a plurality of control signals; and an interface dependent circuit coupled to the mode register setting circuit for receiving the plurality of interface enable signals and operating in a selected interface mode responsive to the plurality of interface enable signals, whereby the semiconductor device is compatible with a plurality of system level interfaces.

A further aspect of the present invention is a semiconductor device compatible with a first interface, the device comprising: an input buffer; a reference voltage generator; a pad for receiving a reference voltage; a control circuit for generating an interface enable signal; an interface dependent circuit coupled to the control circuit for operating with a second interface responsive to the interface enable signal; a first switch coupled between the reference voltage generator and the input buffer for transmitting the reference voltage from the reference voltage generator to the input buffer responsive to the interface enable signal; and a second switch coupled between the pad and the input buffer for transmitting the reference voltage from the pad to the input buffer responsive to the interface enable signal; whereby the semiconductor device can be configured to be compatible with the first and second interfaces responsive to interface selection information.

The control circuit preferably includes: an interface control circuit for activating an interface control signal when an interface selection mode is set; and an enable circuit coupled to the interface control circuit for generating an interface enable signal responsive to the interface control signal.

Another aspect of the present invention is a semiconductor device compatible with a first interface, the device comprising: an input buffer; a reference voltage generator; a pad for receiving a reference voltage; a mode register setting circuit for activating an interface enable signal responsive to an input address and a plurality of control signals; an interface dependent circuit coupled to the mode register setting circuit for operating with a second interface responsive to the interface enable signal; a first switch coupled between the reference voltage generator and the input buffer for transmitting the reference voltage from the reference voltage generator to the input buffer responsive to the interface enable signal; and a second switch coupled between the pad and the input buffer for transmitting the reference voltage from the pad to the input buffer responsive to the interface enable signal; whereby the semiconductor device can be configured to be compatible with the first and second interfaces responsive to interface selection information.

Yet another aspect of the present invention is a method for driving a semiconductor device that is compatible with a plurality of interfaces, the method comprising: (a) setting the device in an interface selection mode; (b) activating one of a plurality of interface enable signals; and (c) setting the operation of an interface dependent circuit responsive to the active interface enable signal such that the interface dependent circuit operates with a selected interface.

A further aspect of the present invention is a method for driving a semiconductor device that is compatible with a plurality of interfaces, the method comprising: (a) activating a mode register setting circuit responsive to a plurality of control signals; (b) inputting a row address to the mode register setting circuit when the mode register setting circuit is activated; (c) setting an interface selection mode according to the row address; (d) activating one of a plurality of interface enable signals responsive to the row address; and (e) setting the operation of an interface dependent circuit responsive to the active interface enable signal such that the interface dependent circuit operates with a selected interface.

A further aspect of the present invention is a method for driving a semiconductor device that is compatible with a plurality of interfaces, the method comprising: (a) setting the device in an interface selection mode; (b) generating an interface enable signal; (c) setting the operation of an interface dependent circuit responsive to the interface enable signal such that the interface dependent circuit operates with a selected interface; (d) isolating a reference voltage generated inside the device from an input buffer; and (e) applying a reference voltage from outside of the device to the input buffer.

A further aspect of the present invention is a method for driving a semiconductor device that is compatible with a plurality of interfaces, the method comprising: (a) enabling a mode register setting circuit responsive to a plurality of control signals; (b) inputting a row address when the mode register setting circuit is activated; (c) setting an interface selection mode responsive to the row address; (d) generating an interface enable signal responsive to the row address; (e) setting the operation of an interface dependent circuit responsive to the interface enable signal such that the interface dependent circuit operates with a selected interface; (d) isolating a reference voltage generated inside the device from an input buffer; and (e) applying a reference voltage from outside of the device to the input buffer.

An advantage of the present invention is that it provides a semiconductor device that can be configured for compatibility with various interfaces at the system level.

The foregoing and other objects, features and advantages of the invention will become more readily apparent from the following detailed description of a preferred embodiment of the invention which proceeds with reference to the accompanying drawings.

DETAILED DESCRIPTION

Figure 1:
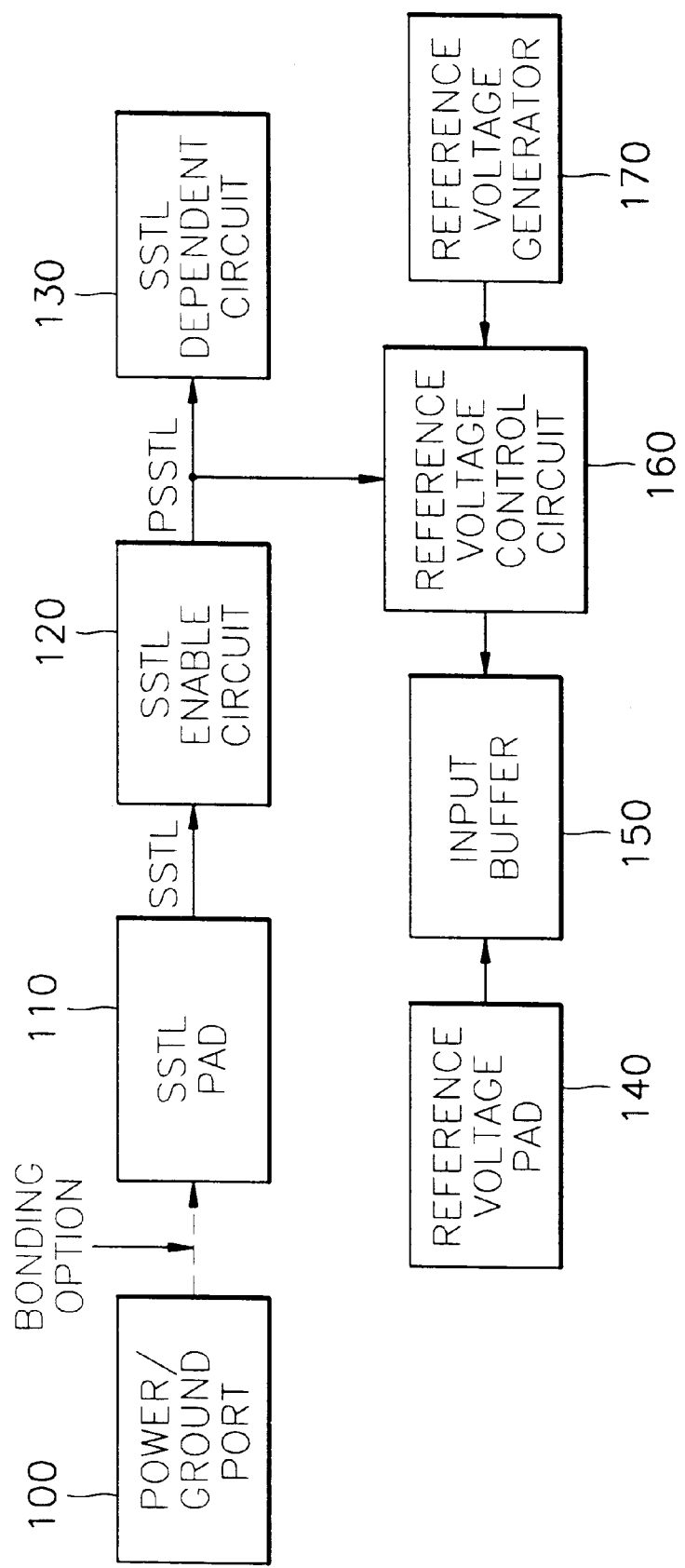
FIG. 1 is a block diagram of a prior art semiconductor device that is compatible with multiple interfaces.
Figure 2:
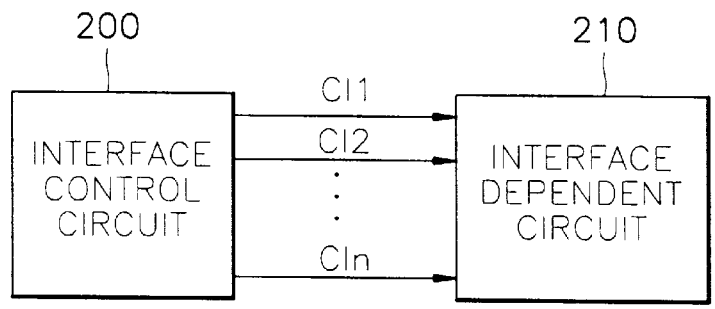
FIG. 2 is a block diagram of a first embodiment of a semiconductor device that is compatible with a plurality of interfaces according to the present invention.

FIG. 2 is a block diagram of a first embodiment of a semiconductor device that is compatible with a plurality of interfaces according to the present invention. The circuit of FIG. 2 includes an interface control circuit 200 and an interface dependent circuit 210.

When an interface selection mode is set by a user, the interface control circuit 200 activates one of a plurality of interface enable signals CI1~CIn responsive to interface selection information provided by the user. The interface dependent circuit 210 receives the plurality of interface enable signals CI1~CIn and uses them to determine which interface to provide compatibility with. The interface dependent circuit then operates according to the requirements of the selected interface.

Figure 3:
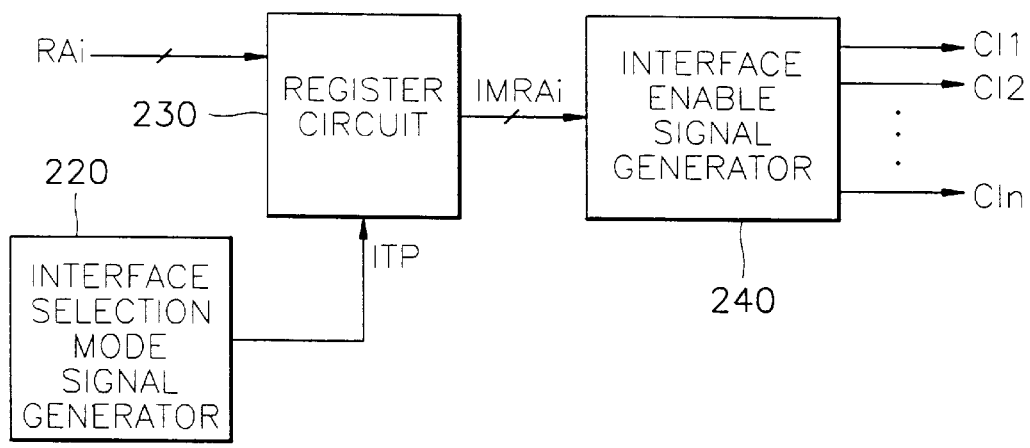
FIG. 3 is a block diagram of an exemplary embodiment of the interface control circuit of FIG. 2.

FIG. 3 is a block diagram of an exemplary embodiment of the interface control circuit 200 of FIG. 2. Referring to FIG. 3, the interface control circuit 200 includes an interface selection mode signal generator 220, a register circuit 230, and an interface enable signal generator 240.

The interface selection mode signal generator 220 generates an interface selection mode signal ITP when the device is placed in an interface selection mode. The register circuit 230 receives and stores a row address signal (RAi) in response to the interface selection mode signal ITP and transmits the stored row address signal as an interface mode row address signal (IMRAi). The interface enable signal generator 240 receives and decodes the interface mode row address signal (IMRAi) and generates the plurality of interface enable signals CI1~CIn.

Figure 4:
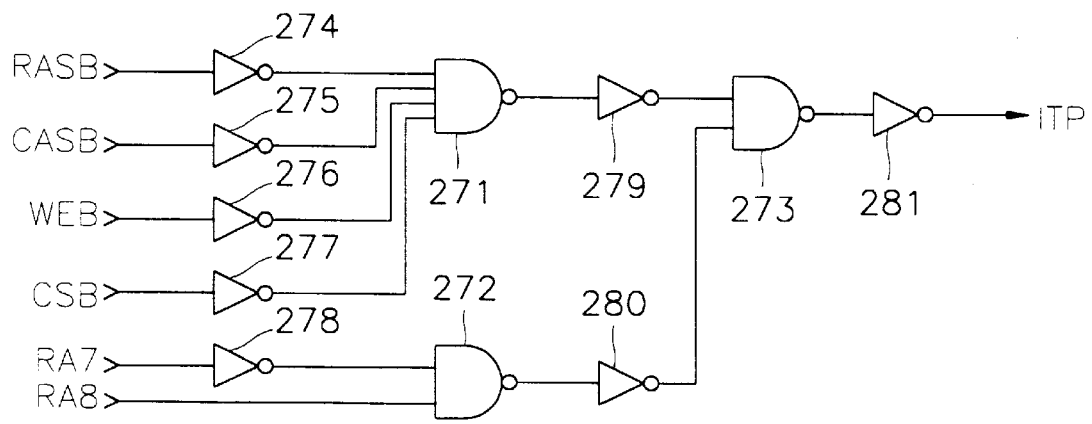
FIG. 4 is a circuit diagram of an exemplary embodiment of the interface selection mode signal generator of FIG. 3.

FIG. 4 is a circuit diagram of an exemplary embodiment of the interface selection mode signal generator 220 of FIG. 3. Referring to FIG. 4, the interface selection mode signal generator 220 includes NAND gates 271, 272 and 273, and inverters 274~281.

The inverters 274~277 invert a row address strobe signal (RASB), a column address strobe signal (CASB), a write enable signal (WEB) and a chip selection signal (CSB), respectively. The NAND gate 271 receives the signals generated by the inverters 274~277 and generates a signal which is low when all input signals are high. That is, the NAND gate 271 generates a signal which is low when the voltage levels of all of RASB, CASB, WEB and CSB are low.

The inverter 278 inverts a row address signal RA7. The NAND gate 272 receives the output of the inverter 278 and a row address signal RA8 and generates a signal which is low when all of its input signals are high. That is, the NAND gate 272 receives the row address signals RA7 and RA8 and generates a signal which is low when the voltage levels of the row address signals RA7 and RA8 are low and high, respectively.

The inverter 279 inverts the signal generated by the NAND gate 271, and the inverter 280 inverts the signal generated by the NAND gate 272. The NAND gate 273 receives the signals generated by the inverters 279 and 280 and generates a signal which is low when all of its input signals are high. The inverter 281 inverts the signal generated by the NAND gate 273, and generates the interface selection mode signal ITP.

Thus, the interface selection mode signal generator 220 activates the interface selection mode signal ITP when RASB, CASB, WEB and CSB are all low, and RA7 and RA8 are low and high, respectively.

Figure 5:
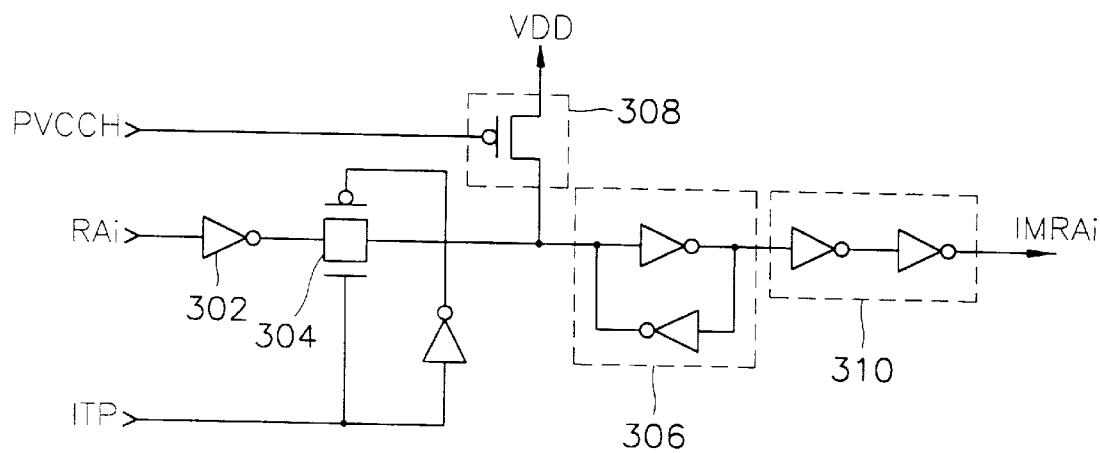
FIG. 5 is a circuit diagram of an exemplary embodiment of the register circuit of FIG. 3.

FIG. 5 is a circuit diagram of an exemplary embodiment of the register circuit 230 of FIG. 3. Referring to FIG. 5, the register circuit 230 includes an inverter 302, a transmission gate 304, latch means 306, precharge means 308 and a driving unit 310.

The inverter 302 inverts a row address signal RAi. The transmission gate 304 receives the signal generated by the inverter 302 in response to the interface selection mode signal ITP to transmit the received signal. That is, the transmission gate 304 receives the signal generated by the inverter 302 and transmits the received signal when the interface selection mode signal ITP is high.

The precharge means 308 precharges the input of the latch means 306 in response to an input signal PVCCH. The input signal PVCCH is switched from low to high when the register circuit 230 is enabled by the interface selection mode signal ITP. The precharge means 308 is connected between a power port VDD and the input port of the latch means 306, and includes a PMOS transistor that is gated by the signal PVCCH which is active (low) before the interface selection mode signal ITP is activated, and deactivated (switched to high) when the interface selection mode signal ITP is activated.

The latch means 306 latches the signal transmitted from the transmission gate 304. The driving means 310 drives the latched signal stored in the latch means 306 and generates the output from the register circuit 230 as IMRAi.

Figure 6:
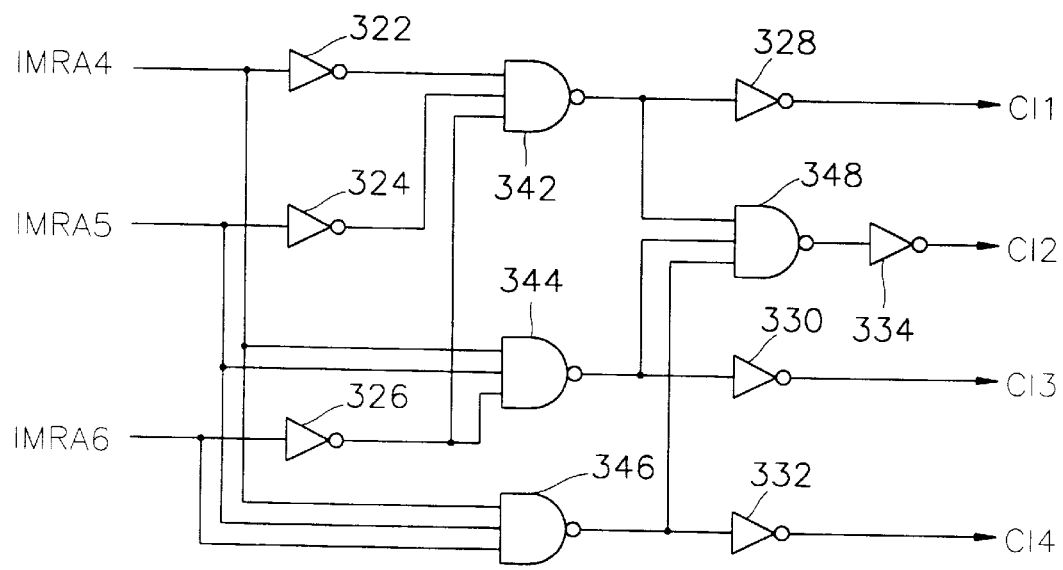
FIG. 6 is a circuit diagram of an exemplary embodiment of the interface enable signal generator of FIG. 3.

FIG. 6 is a circuit diagram of an exemplary embodiment of the interface enable signal generator 240 of FIG. 3. Referring to FIG. 6, the interface enable signal generator 240 includes inverters 322~334, and NAND gates 342~348.

The inverter 322 inverts the data signal IMRA4 generated by the register circuit 230. The inverter 324 inverts the data signal IMRA5 generated by the register circuit 230. The inverter 326 inverts the data signal IMRA6 generated by the register circuit 230.

The NAND gate 342 receives the signals generated by the inverters 322, 324 and 326 and generates a signal which is low when all of its input signals are high. That is, the NAND gate 342 generates a signal which is low when the data signals IMRA4, IMRA5 and IMRA6 are all low. The NAND gate 344 receives the data signals IMRA4 and IMRA5 generated by the register circuit 230 and a signal generated by the inverter 326 and generates a signal which is low when all of its input signals are high. That is, the NAND gate 344 generates a signal which is low when the data signals IMRA4 and IMRA5 are both high, and the data IMRA6 is low. The NAND gate 346 generates a signal which is low when all of the data signals IMRA4, IMRA5 and IMRA6 generated by the register circuit 230 are high.

The inverters 328, 330 and 332 invert the outputs from the NAND gates 342, 344 and 346, respectively, and generates interface enable signals CI1, CI3 and CI4, respectively. The NAND gate 348 receives the outputs from the NAND gates 342, 344 and 346 and generates a signal which is low only when the outputs of the NAND gates 342, 344 and 346 are all high. The inverter 334 inverts the output from the NAND gate 348, thereby generating the interface enable signal CI2.

Table 2 is a truth table for the interface enable signals CI1~CI4 that are generated by the interface enable signal generator of FIG. 6 responsive to the combination of the data signals IMRA4, IMRA5 and IMRA6.

TABLE 2

| IMRA4 | IMRA5 | IMRA6 | CI1 | CI2 | CI3 | CI4 |
|---|---|---|---|---|---|---|
| 0 | 0 | 0 | 1 | 0 | 0 | 0 |
| 0 | 0 | 1 | 0 | 1 | 0 | 0 |
| 0 | 1 | 0 | 0 | 1 | 0 | 0 |
| 0 | 1 | 1 | 0 | 1 | 0 | 0 |
| 1 | 0 | 0 | 0 | 1 | 0 | 0 |
| 1 | 0 | 0 | 0 | 1 | 0 | 0 |
| 1 | 1 | 0 | 0 | 0 | 1 | 0 |
| 1 | 1 | 1 | 0 | 0 | 0 | 1 |

The semiconductor device of FIG. 2 provides compatibility with a selected interface in response to selection information from the user. Thus, it is unnecessary to configure the device for compatibility with a specific interface before assembly, so the cost of manufacturing the product is reduced.

Figure 7:
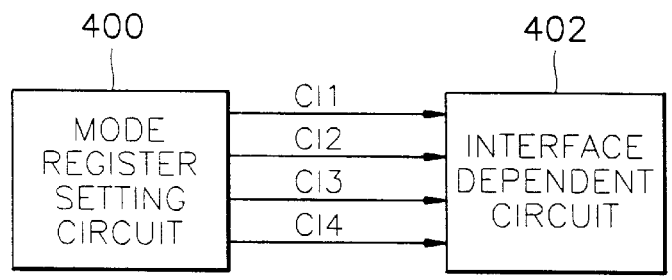
FIG. 7 is a block diagram of a second embodiment of a semiconductor device that is compatible with a plurality of interfaces according to the present invention.

FIG. 7 is a block diagram of a second embodiment of a semiconductor device that is compatible with a plurality of interfaces according to the present invention. Referring to FIG. 7, the semiconductor device includes a mode register setting circuit 400 and an interface dependent circuit 402.

The mode register setting circuit 400 is enabled by RASB, CASB, CSB and WEB and sets the CAS latency, burst type and burst length in response to RASB, CASB, CSB and WEB. The mode register setting circuit 400 determines the CAS latency, burst type and burst length in accordance with the combination of input row address signals RAi and then generates the CAS latency mode signals (not shown), the burst type mode signals (not shown) and the burst length mode signals (not shown) accordingly. The states of the CAS latency mode signals, burst type mode signal and burst length mode signals are not changed until the mode register setting circuit 400 is enabled again to set a mode. That is, the mode register setting circuit 400 is enabled, and the CAS latency and burst length are determined according to the combination of the input row address signal RAi. Accordingly, one of the CAS latency mode signals and one of the burst length mode signals are enabled not changed until the mode register setting circuit 400 is enabled again to set the mode.

The mode register setting circuit 400 sets the interface selection mode using a non-specified portion of the combination of the row address signal RAi in order to determine he CAS latency and the burst length, and then activates the corresponding one of the lurality of interface enable signals CI1~CI4.

The interface dependent circuit 402 receives the interface enable signals CI1~CI4 generated by the mode register setting circuit 400 and operates with a selected interface responsive to the plurality of interface enable signals.

Figure 8:
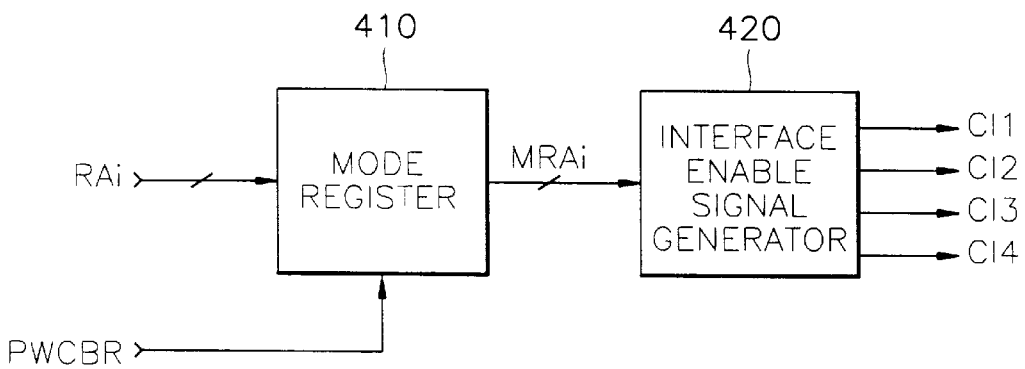
FIG. 8 is a block diagram of an exemplary embodiment of the mode register setting circuit of FIG. 7.

FIG. 8 is a block diagram of an exemplary embodiment of the mode register setting circuit of FIG. 7. Referring to FIG. 8, the mode register setting circuit 400 includes a mode register. 410 and an interface enable signal generator 420.

The mode register 410 is enabled in response to an interface selection mode signal PWCBR. The mode register 410 receives and stores a row address signal RAi generated by a row address buffer circuit (not shown) and transmits the stored row address signal as a mode row address signal MRAi. The interface selection mode signal PWCBR is active when RASB, CASB, CSB and WEB are all low.

The interface enable signal generator 420 receives and decodes the mode row address signal MRAi and transmits the decoded mode row address signal MRAi as a plurality of interface enable signals CI1, CI2, CI3 and CI4.

Figure 9:
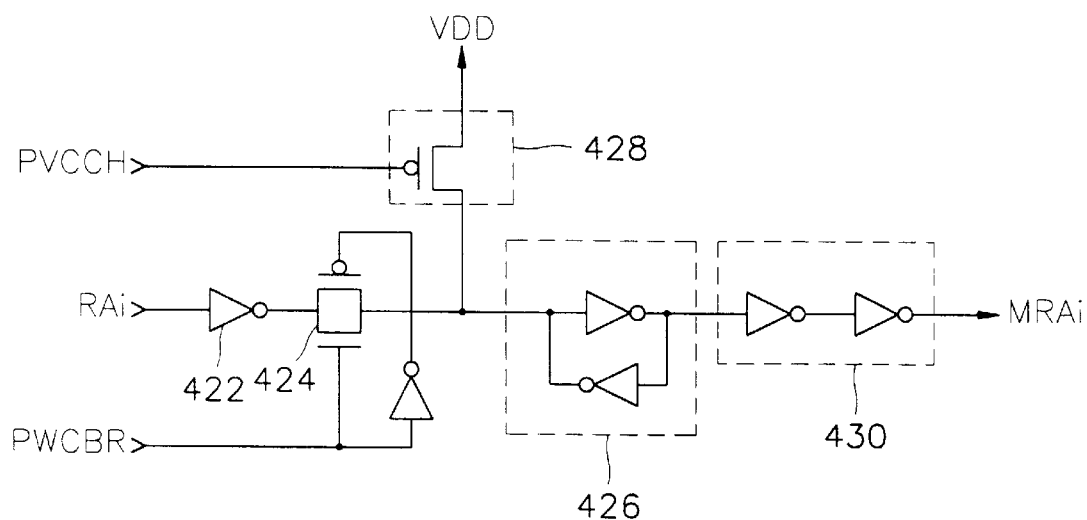
FIG. 9 is a circuit diagram of an exemplary embodiment of the mode register of FIG. 8.

FIG. 9 is a circuit diagram of an exemplary embodiment of the mode register 410 of FIG. 8. Referring to FIG. 9, the mode register 410 includes an inverter 422, a transmission gate 424, latch means 426, precharge means 428 and a driving unit 430.

The inverter 422 inverts the row address signal RAi generated by a row address buffer circuit (not shown). The transmission gate 424 receives the signal generated by the inverter 422 and transmits the signal in response to an interface selection mode signal PWCBR. That is, when the interface selection mode signal PWCBR is high, the transmission gate 424 transmits the signal generated by the inverter 422. The interface selection mode signal PWCBR is active when RASB, CASB, CSB and WEB are all low.

The precharge means 428 precharges the input port of the latch means 426 in response to an input signal PVCCH which switches from low to high when the mode register 410 is enabled by the signal PWCBR. The precharge means is connected between a power port VDD and the input port of the latch means 426, and includes a PMOS transistor that is gated by the signal PVCCH which is active (low) before the interface selection mode signal PWCBR is activated, and deactivated (switched to high) when the interface selection mode signal PWCBR is activated.

The latch means 426 latches the signal transmitted from the transmission gate 424. The driving unit 430 drives the latched signal stored in the latch means 426 and generates the mode row address signals MRAi.

Figure 10:
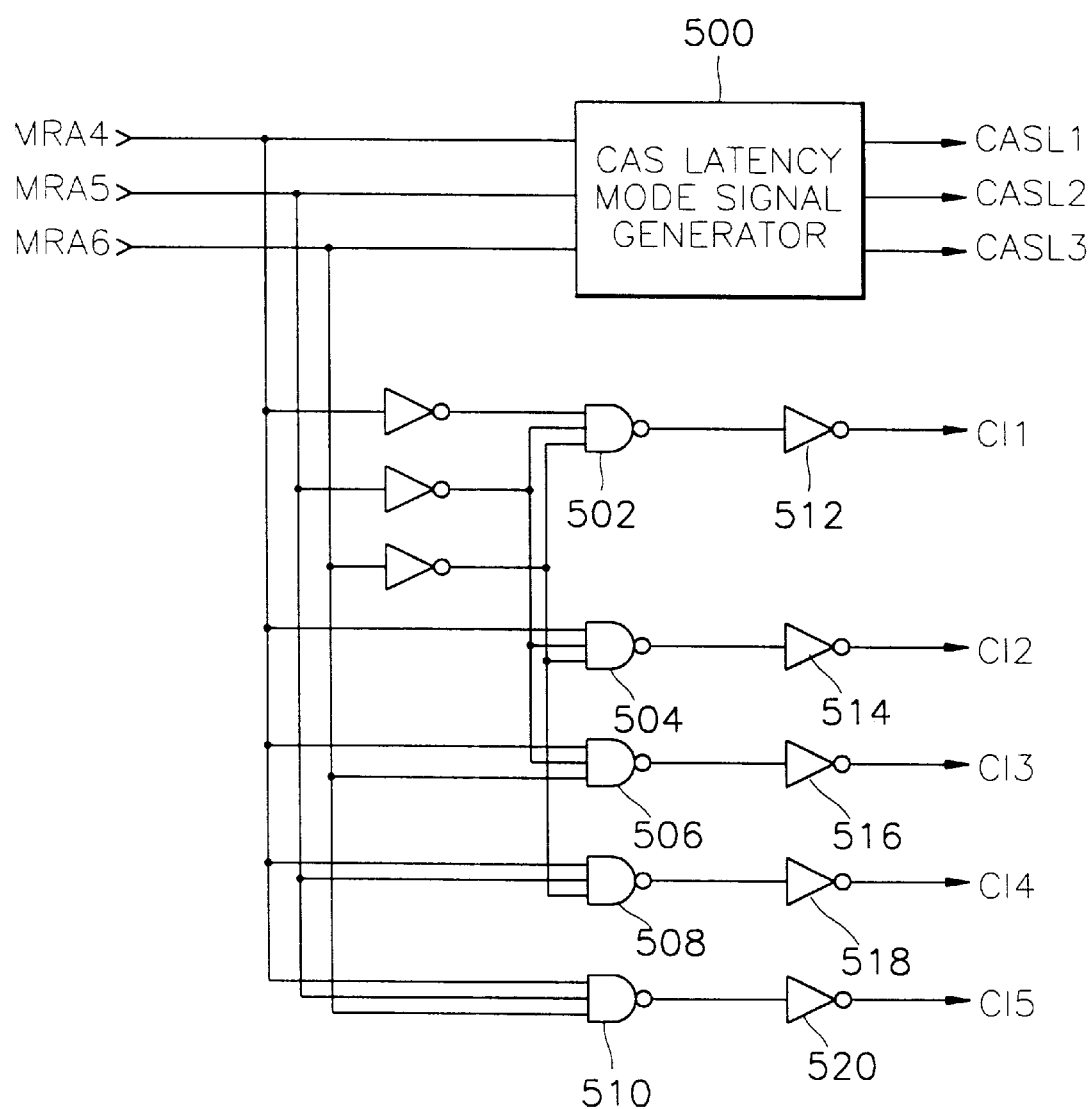
FIG. 10 is a circuit diagram of an exemplary embodiment of the interface enable signal generator of FIG. 8.

FIG. 10 is a circuit diagram of an exemplary embodiment of the interface enable signal generator 420 of FIG. 8. Referring to FIG. 10, the interface enable signal generator 420 includes NAND gates 502~510, inverters 512~520 and a CAS latency mode signal generator 500.

The interface enable signal generator 420 receives the mode row address signals MRAi. The CAS latency mode signal generator 500 sets the CAS latency in accordance with the signals input to the mode register setting circuit 400 shown in FIG. 7 (i.e., RASB, CASB, CSB, WEB and RA) to activate one of the CAS latency mode signals CASL1, CASL2 and CASL3 corresponding to the desired CAS latency.

The NAND gate 502 receives the mode row address signals MRA4, MRA5 and MRA6 and generates a signal that is low when the mode row address signals MRA4, MRA5 and MRA6 are all low. The NAND gate 504 generates a signal that is low when the mode row address signal MRA4 is high and MRA5 and MRA6 are both low. The NAND gate 506 generates a signal that is low when the mode row address signals MRA4 and MRA6 are both high and MRA4 is low. The NAND gate 508 generates a signal that is low when the mode row address signals MRA4 and MRA5 are both high and MRA6 is low. The NAND gate 510 generates a signal which is low when the mode row address signals MRA4, MRA5 and MRA6 are all high.

The inverters 512~520 invert the signals generated by NAND gates 502~510, respectively, thereby generating the interface enable signals CI1~CI5, respectively.

Table 3 is a truth table for the CAS latency mode signals CASL1, CASL2 and CASL3, and the interface enable signals CI1~CI5, which are generated responsive to the mode row address signals MRA4, MRA5 and MRA6.

Figure 11:
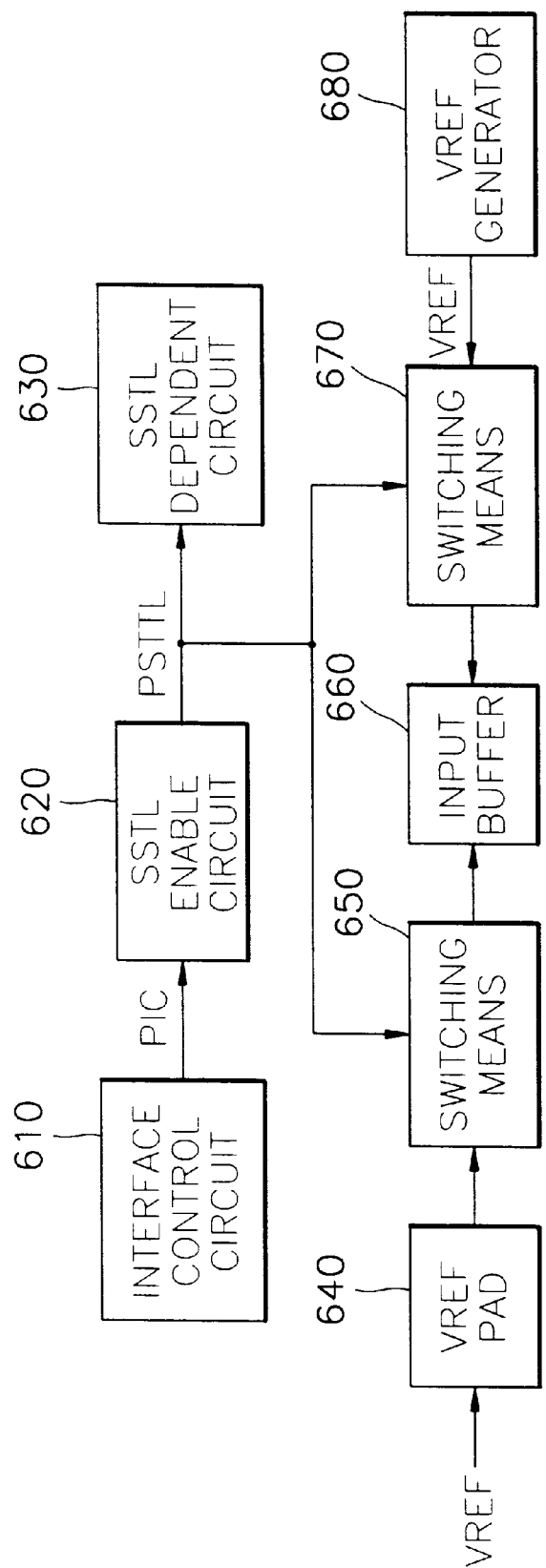
FIG. 11 is a block diagram of a third embodiment of a semiconductor device that is compatible with a plurality of interfaces according to the present invention.
Figure 12:
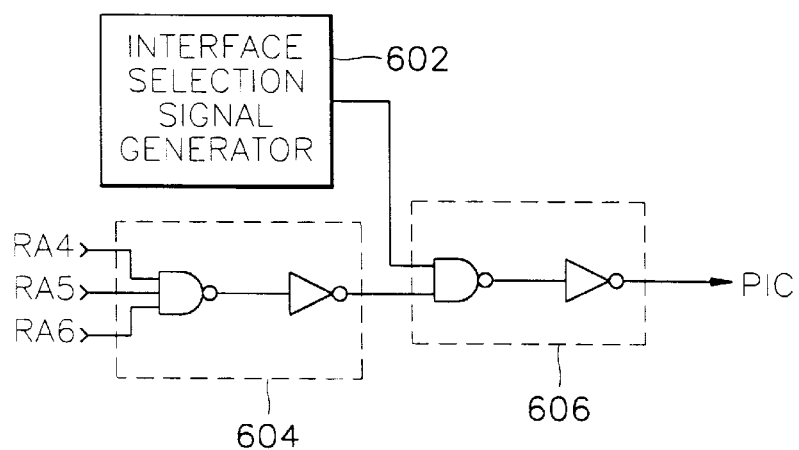
FIG. 12 is a circuit diagram of an exemplary embodiment of the interface control circuit of FIG. 11.

FIG. 12 is a block diagram of an exemplary embodiment of the interface control circuit 610 of FIG. 11. Referring to FIG. 12, the interface control circuit 610 includes an interface selection signal generator 602, an interface mode signal generator 604 and an interface control signal generator 606.

The interface selection signal generator 602 generates an interface selection signal that is active when all of the control signals controlling the operation of the semiconductor device are active. That is, the interface selection signal generator 602 activates the interface selection signal when RASB, CASB, WEB and CSB are all low. The interface mode signal generator 604 receives row address signals RA4, RA5 and RA6 and activates an interface mode signal responsive to a combination of the row address signals RA4,

TABLE 3

| MRA4 | MRA5 | MRA6 | CASL1 | CASL2 | CASL3 | CI1 | CI2 | CI3 | CI4 | CI5 |
|---|---|---|---|---|---|---|---|---|---|---|
| 0 | 0 | 0 | 0 | 0 | 0 | 1 | 0 | 0 | 0 | 0 |
| 0 | 0 | 1 | 1 | 0 | 0 | 0 | 0 | 0 | 0 | 0 |
| 0 | 1 | 0 | 0 | 1 | 0 | 0 | 0 | 0 | 0 | 0 |
| 0 | 1 | 1 | 0 | 0 | 1 | 0 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

The circuit of FIG. 7 utilizes the mode register setting circuit to configure the semiconductor device for compatibility with multiple interfaces. Thus, it is unnecessary to configure the device when it is assembled, so the cost of a manufacturing the device is reduced.

FIG. 11 is a block diagram of a third embodiment of a semiconductor device that is compatible with a plurality of interfaces according to the present invention.

Referring to FIG. 11, the semiconductor device includes an interface control circuit 610, a stub series terminated transceiver logic (SSTL) enable circuit 620, an SSTL dependent circuit 630, a reference voltage pad 640, switching means 650 and 670, an input buffer 660 and a reference voltage generator 680.

The interface control circuit 610 activates an interface control signal PIC when an interface selection mode is selected. The SSTL enable circuit 620 receives the interface control signal PIC and generates an SSTL interface enable signal PSSTL responsive to the input control signal. The SSTL dependent circuit 630 receives the SSTL interface enable signal PSSTL and operates when the device is configured for compatibility with an SSTL interface. The reference voltage pad 640 receives the reference voltage VREF from outside of the device. The input buffer 660 receives data from outside of the device. The reference voltage generator 680 generates the reference voltage VREF which is applied to the input buffer 660.

The switching means 650 and 670 are controlled by the SSTL interface enable signal PSSTL. Switching means 650 is turned off and switching means 670 is turned on when the device is configured for compatibility with an LVTTL interface so that the reference voltage VREF generated by the reference voltage generator 680 is transmitted to the input buffer 660. When the device is configured for compatibility with an SSTL interface, switching means 650 turns on and switching means 670 turns off so that the reference voltage VREF, which is applied to the reference voltage pad 640, is transmitted to the input buffer 660.

Switching means 650 and 670 can be implemented with transmission gates.

RA5 and RA6. The interface control signal generator 606 receives the interface selection signal and the interface mode signal and generates an interface control signal PIC which is active when all of its input signals are active.

Figure 13:
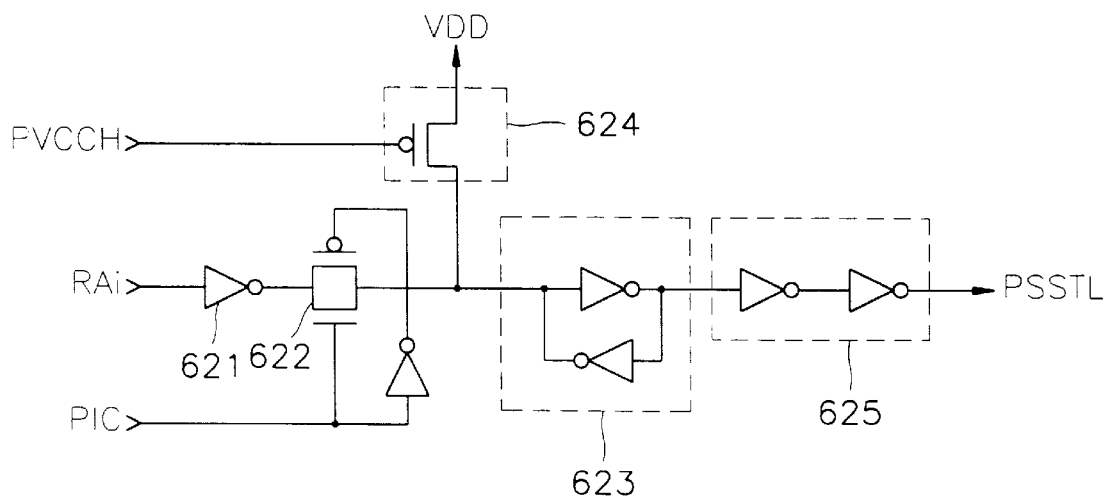
FIG. 13 is a circuit diagram of an exemplary embodiment of the SSTL enable circuit of FIG. 11.

FIG. 13 is a circuit diagram of an exemplary embodiment of the SSTL enable circuit 620 of FIG. 11. Referring to FIG. 13, the SSTL enable circuit 620 includes an inverter 621, a transmission gate 622, latch means 623, precharge means 624 and a driving unit 625.

The inverter 621 receives a row address signal RAi to invert the received row address signal. The transmission gate 622 is controlled by the interface control signal PIC to transmit the signal generated by the inverter 621. The latch means 623 receives the signal generated by the transmission gate 622 to latch the received signal.

The precharge means 624 precharges the input port of the latch means 623. The precharge means 624, which is connected between the power port VDD and the input port of the latch means 623, includes a PMOS transistor that is gated by the input signal PVCCH which is activated (driven low) before the interface control signal PIC becomes active, and deactivated when the interface control signal PIC is active. The driving means 625 drives the output from the latch means 623 and generates the SSTL enable signal PSSTL.

In the semiconductor device of FIG. 11, the SSTL interface enable signal PSSTL is generated by setting the interface selection mode if required, and the SSTL dependent circuit 630 and reference voltage generator 680 are controlled in response to the PSSTL, so that the device can be configured for compatibility with an SSTL interface at the system level. Thus, it is unnecessary to configure the device for a specific interface when it is assembled, and thus, the cost of manufacturing the product is reduced.

Figure 14:
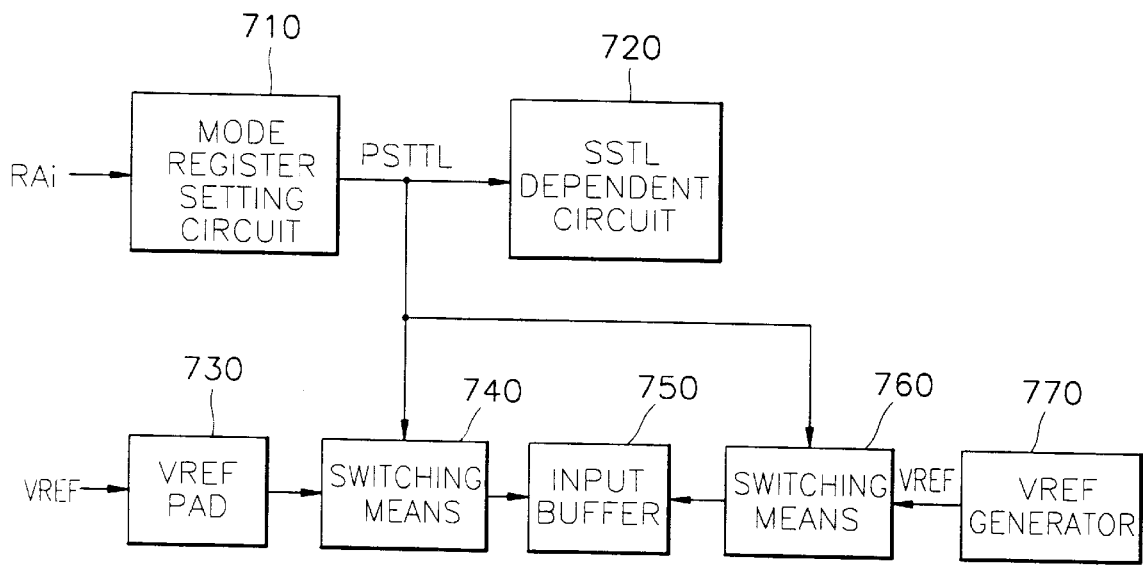
FIG. 14 is a block diagram of a fourth embodiment of a semiconductor device that is compatible with a plurality of interfaces according to the present invention.

FIG. 14 is a block diagram of a fourth embodiment of a semiconductor device that is compatible with a plurality of interfaces according to the present invention. Referring to FIG. 14, the semiconductor device includes a mode register setting circuit 710, an SSTL dependent circuit 720, a reference voltage pad 730, switching means 740 and 760, an input buffer 750, and a reference voltage generator 770.

When RASB, CASB, WEB and CSB are all active, the mode register setting circuit 710 generates an SSTL interface enable signal PSSTL responsive to an input row address signal RAi. The SSTL dependent circuit 720 receives the SSTL interface enable signal PSSTL and operates when the device is configured for compatibility with an SSTL interface. The reference voltage pad 730 receives a reference voltage VREF from outside the device, and the input buffer 750 receives data from outside the device. The reference voltage generator 770 generates the reference voltage VREF that is applied to the input buffer 750 when switching means 760 is enabled.

The switching means 740 and 760 are controlled by the SSTL interface enable signal PSSTL. When the device is configured for compatibility with an LVTTL interface, switching means 740 turns off and switching means 760 turns on such that the reference voltage VREF from the reference voltage generator 770 is transmitted to the input buffer 750. When the device is configured for compatibility with an SSTL interface, switching means 740 turns on and switching means 760 turns off such that the reference voltage VREF from the pad is transmitted to the input buffer 750.

Figure 15:
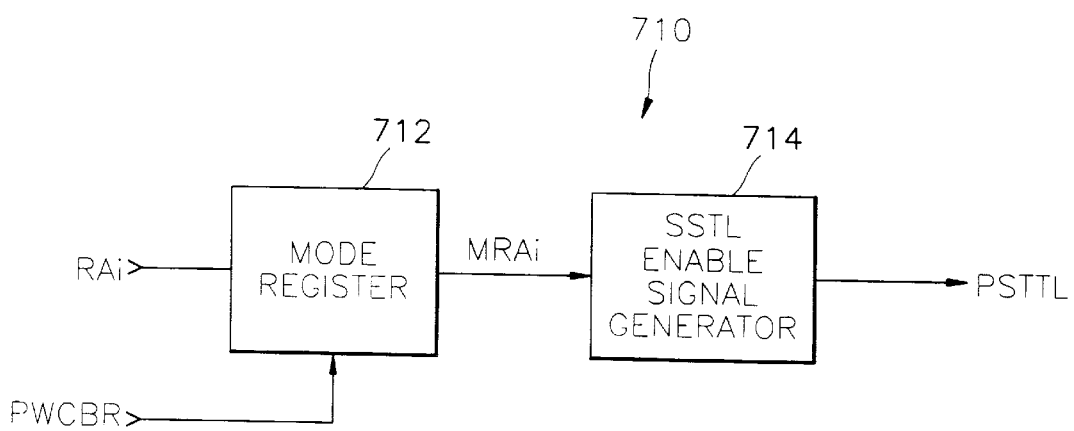
FIG. 15 is a block diagram of an exemplary embodiment of the mode register setting circuit of FIG. 14.

FIG. 15 is a block diagram of an exemplary embodiment of the mode register setting circuit 710 of FIG. 14. Referring to FIG. 15, the mode register setting circuit 710 includes a mode register 712 and an SSTL enable signal generator 714.

The mode register 712 is controlled by an interface selection mode signal PWCBR which is activated when RASB, CASB, WEB and CSB are all low. The mode register 712 receives and stores a row address signal RAi and generates a mode row address signal MRAi. The mode register 712 has the same structure as the mode register 410 of FIG. 8. The SSTL enable signal generator 714 decodes the mode row address signal MRAi, and activates the SSTL enable signal PSSTL.

The semiconductor device of FIG. 14 can be configured for interface compatibility with different interfaces at the system level by using the mode register setting circuit to select the interface in response to signals from outside of the device. Thus, it is unnecessary to configure the device before it is assembled, and thus, the cost of manufacturing the product is reduced.

Figure 16:
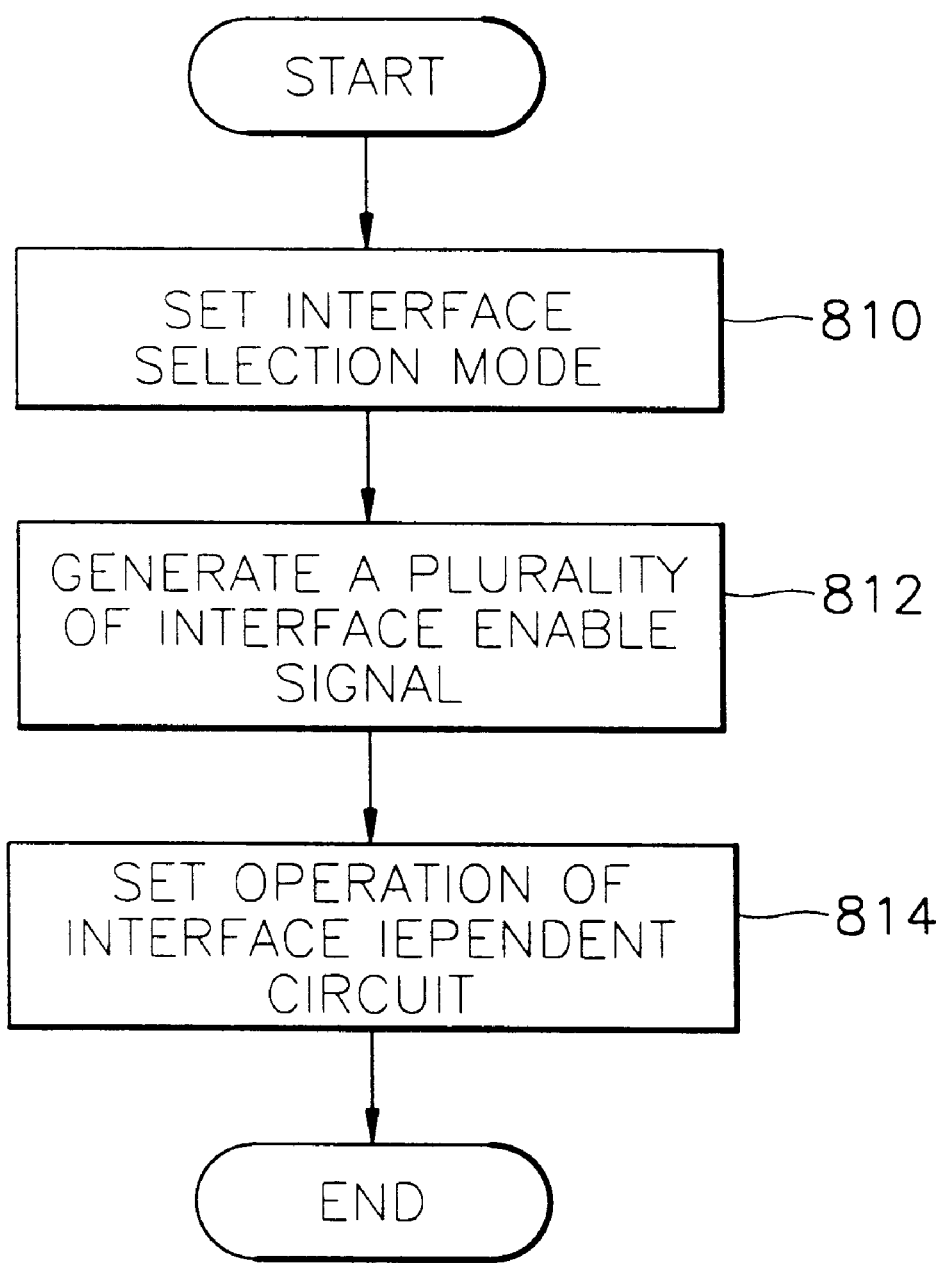
FIG. 16 is a flowchart illustrating an embodiment of a method for driving a semiconductor device that is compatible with a plurality of interfaces according to the present invention.

FIG. 16 is a flowchart illustrating an embodiment of a method for driving a semiconductor device that is compatible with a plurality of interfaces according to the present invention. Referring to FIG. 16, the semiconductor device driving method includes an interface selection mode setting step 810, an interface enable signal generating step 812, and an interface dependent circuit operation setting step 814.

In the interface selection mode setting step 810, an interface selection mode is selected. In the interface enable signal generating step 812, one of a plurality of interface enable signals is activated. In the interface dependent circuit operation setting step 814, the operation of the interface dependent circuit is set responsive to the interface enable signal that was activated in the interface enable signal generating step 812.

Figure 17:
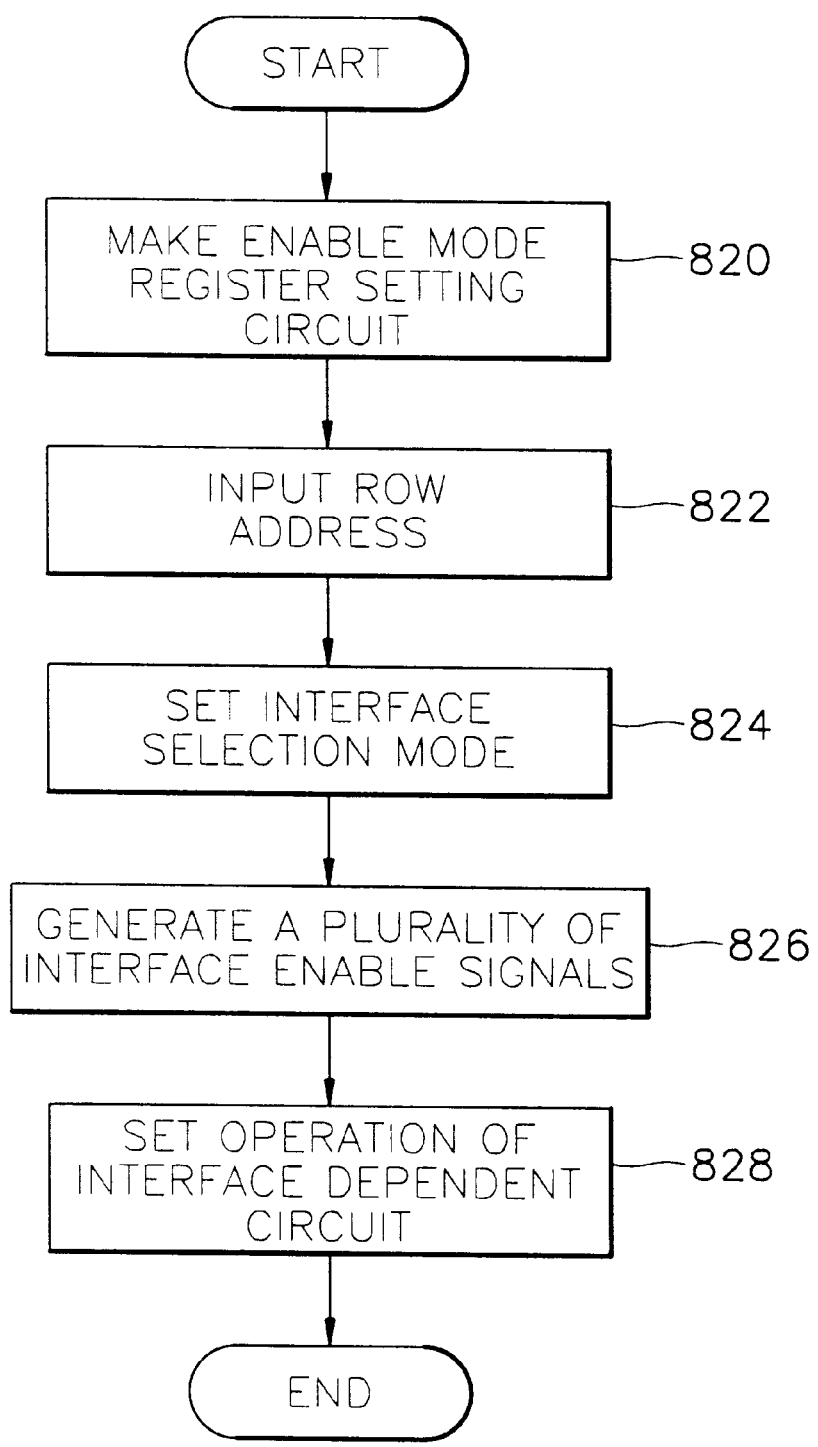
FIG. 17 is a flowchart illustrating a second embodiment of a method for driving a semiconductor device that is compatible with a plurality of interfaces according to the present invention.

FIG. 17 is a flowchart illustrating a second embodiment of a method for driving a semiconductor device that is compatible with a plurality of interfaces according to the present invention. Referring to FIG. 17, the semiconductor device driving method includes a mode register setting circuit enabling step 820, a row address signal input step 822, an interface selection mode setting step 824, an interface enable signal generating step 826 and an interface dependent circuit operation setting step 828.

In the mode register setting circuit enabling step 820, the mode register setting circuit is enabled responsive to RASB, CASB, WEB and CAB which are input from outside of the device. In the row address signal inputting step 822, the row address signal is input when the mode register setting circuit is activated. In the interface selection mode setting step 824, the interface selection mode is set according to the combination of the row address signals input in the row address signal inputting step 822. In the interface enable signal generating step 826, a corresponding one of the plurality of interface enable signals is activated after the interface selection mode setting step 824. In the interface dependent circuit operation setting step 828, the operation of the interface dependent circuit is set responsive to the interface enable signal that was activated in the interface enable signal generating step 826.

The methods illustrated in FIGS. 16 and 17 reduce the cost of manufacturing a semiconductor device that is compatible with a plurality of interfaces because the device can be configured for compatibility with a specific interface after assembly.

Figure 18:
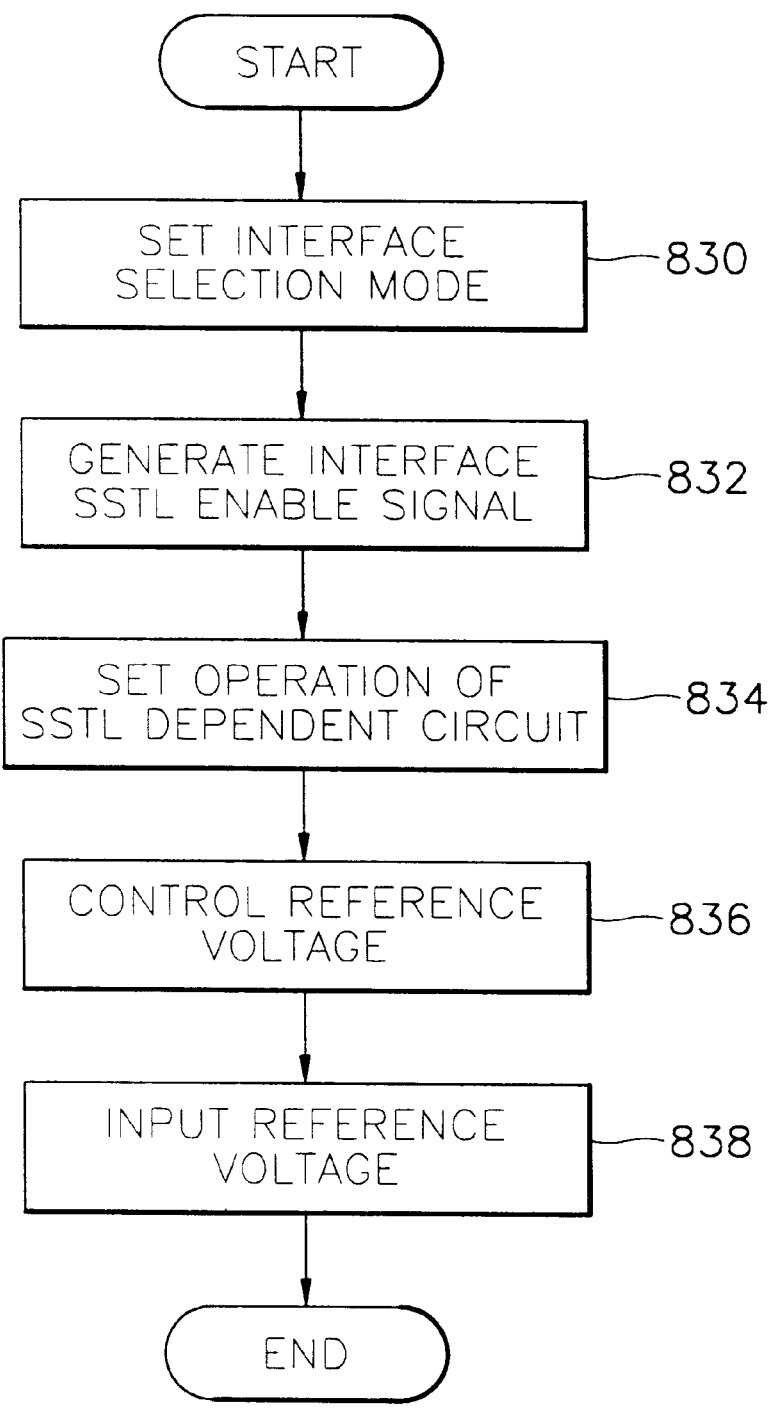
FIG. 18 is a flowchart illustrating a third embodiment of a method for driving a semiconductor device that is compatible with a plurality of interfaces according to the present invention.

FIG. 18 is a flowchart illustrating a third embodiment of a method for driving a semiconductor device that is compatible with a plurality of interfaces according to the present invention. Referring to FIG. 18, the semiconductor device driving method includes an interface selection mode setting step 830, an SSTL interface enable signal generating step 832, an SSTL dependent circuit operation setting step 834, a reference voltage control step 836 and a reference voltage inputting step 838.

In the interface selection mode setting step 830, the interface selection mode is set. In the SSTL interface enable signal generating step 832, an SSTL interface enable signal is generated after the interface selection mode setting step 830. In the SSTL dependent circuit operation setting step 834, the operation of the SSTL dependent circuit is set responsive to the SSTL interface enable signal, wherein the operation of the SSTL dependent circuit is compatible with an SSTL interface. In the reference voltage controlling step 836, the reference voltage from the reference voltage generator is controlled so that it is isolated from the input buffer. In the reference voltage input step 838, the reference voltage from outside of the device is applied to the input buffer.

The method illustrated in FIG. 18 reduces the cost of manufacturing a semiconductor device that is compatible with a plurality of interfaces because device can be configured to operate with either an LVTTL interface or an SSTL interface at the system level after the device is assembled.

Figure 19:
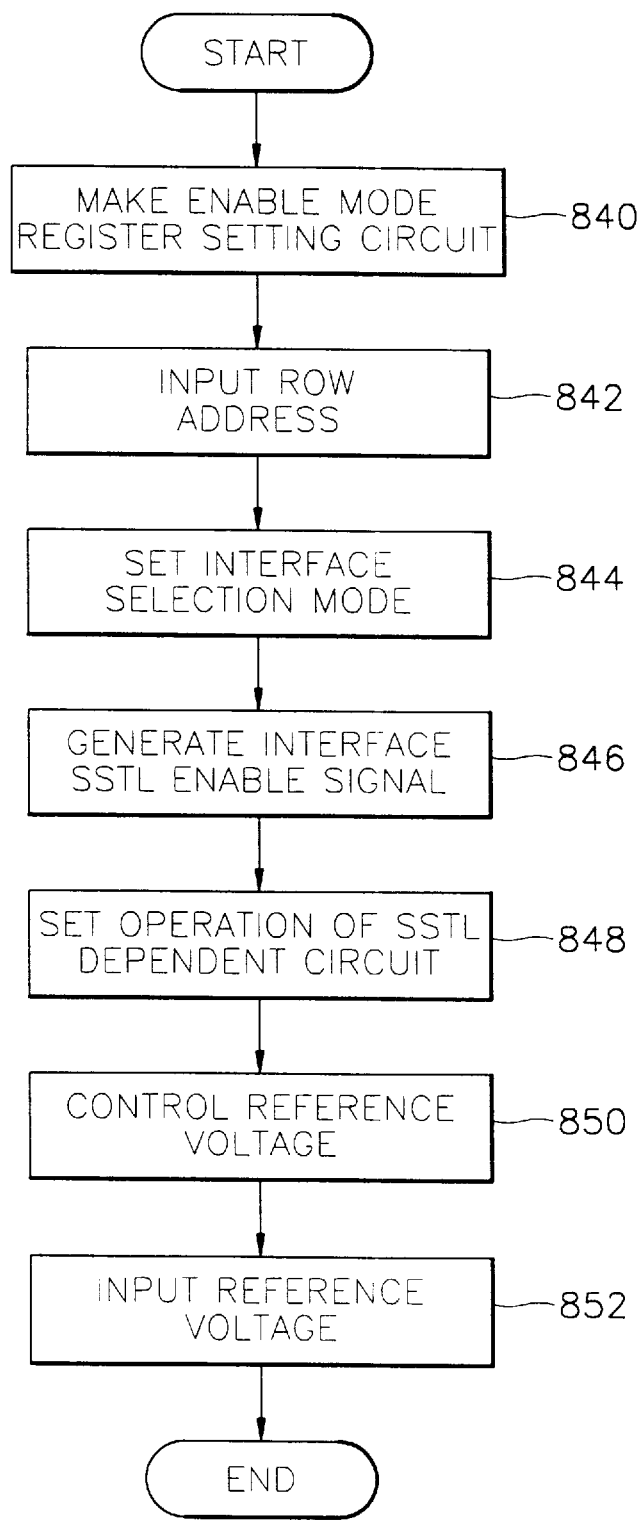
FIG. 19 is a flowchart illustrating a fourth embodiment of a method for driving a semiconductor device that is compatible with a plurality of interfaces according to the present invention.

FIG. 19 is a flowchart illustrating a fourth embodiment of a method for driving a semiconductor device that is compatible with a plurality of interfaces according to the present invention. Referring to FIG. 19, the semiconductor device driving method includes a mode register setting circuit enabling step 840, a row address signal input step 842, an interface selection mode setting step 844, an SSTL interface enable signal generating step 846, an SSTL dependent circuit operation setting step 848, a reference voltage controlling step 850 and a reference voltage input step 852.

In the mode register setting circuit enabling step 840, the mode register setting circuit is activated responsive to RASB, CASB, WEB and CSB which are input from outside of the device. In the row address signal inputting step 842, a row address signal is input when the mode register setting circuit is activated. In the interface selection mode setting step 844, an interface selection mode is set according to the combination of the row address signals input in the row address signal inputting step 842. In the SSTL interface enable signal generating step 846, an SSTL interface enable signal is generated after the interface selection mode setting step 842. In the SSTL dependent circuit operation setting step 848, the operation of the SSTL dependent circuit is set responsive to the SSTL interface enable signal, wherein the operation of the SSTL dependent circuit is compatible with an SSTL interface. In the reference voltage controlling step 850, the reference voltage from the reference voltage generator is controlled so that it is isolated from the input buffer. In the reference voltage input step 852, the reference voltage from outside of the device is applied to the input buffer.

The method illustrated in FIG. 19 reduces the cost of manufacturing a semiconductor device that is compatible with a plurality of interfaces because device can be configured to operate with either an LVTTL interface or an SSTL interface at the system level after the device is assembled in response to signals from outside of the device.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A semiconductor device comprising:
   an interface control circuit for activating one of a plurality of interface enable signals responsive to at least one input signal for selecting an interface mode, and an address signal; and
   an interface dependent circuit coupled to the interface control circuit for receiving the plurality of interface enable signals and operating in a selected interface mode responsive to the plurality of interface enable signals, whereby the semiconductor device is compatible with a plurality of system level interfaces.

2. A semiconductor device comprising:
   an interface control circuit for activating one of a plurality of interface enable signals responsive to at least one input signal for selecting an interface mode; and
   an interface dependent circuit coupled to the interface control circuit for receiving the plurality of interface enable signals and operating in a selected interface mode responsive to the plurality of interface enable signals, whereby the semiconductor device is compatible with a plurality of system level interfaces;
   wherein the interface control circuit comprises:
   a register circuit for receiving a row address signal and generating an interface mode row address signal responsive to the row address signal and an interface selection mode signal;
   an interface selection mode signal generator coupled to the register circuit for generating the interface selection mode signal responsive to the at least one input signal for selecting an interface mode; and
   an interface enable signal generator coupled to the register circuit for decoding the interface mode row address signal and activating one of the plurality of interface enable signals.

3. The semiconductor device of claim 2 wherein the interface selection mode signal generator activates the interface selection mode signal when a row address strobe signal, a column address strobe signal, a write enable signal and a chip selection signal are all active.

4. The semiconductor device of claim 2 wherein the register circuit comprises:

a first inverter for inverting the row address signal;
a transmission gate coupled to the first inverter for transmitting the output from the first inverter responsive to the interface selection mode signal;
a latch coupled to the transmission gate for latching the signal from the transmission gate;
a precharge circuit coupled to the latch for precharging an input port of the latch; and
a drive circuit coupled to the latch for driving the output from the latch, thereby generating the interface mode row address signal.

5. The semiconductor device of claim 4 wherein the precharge circuit is coupled between a power port and the input port of the latch, and includes a transistor that is gated by a signal that is activated before the interface selection mode signal is active and deactivated when the interface selection mode signal is active.

6. The semiconductor device of claim 2 wherein the interface enable signal generator comprises:
   a first logic gate for receiving three row address signals from the register circuit and generating a first interface enable signal which is active when the three row address signals are all inactive;
   a second logic gate for receiving the three row address signals from the register circuit and generating a second interface enable signal which is active when two of the three row address signals are active and the remaining row address signal is inactive;
   a third logic gate for receiving the three row address signals from the register circuit and generating a third interface enable signal which is active when the three row address signals are all active; and
   a fourth logic gate for coupled to the first, second, and third logic gates for generating a fourth output signal responsive to the first second and third interface enable signals.

7. A semiconductor device comprising:
   a mode register setting circuit for activating one of a plurality of interface enable signals responsive to an input address and a plurality of control signals; and
   an interface dependent circuit coupled to the mode register setting circuit for receiving the plurality of interface enable signals and operating in a selected interface mode responsive to the plurality of interface enable signals, whereby the semiconductor device is compatible with a plurality of system level interfaces.

8. A semiconductor device comprising:
   a mode register setting circuit for activating one of a plurality of interface enable signals responsive to an input address and a plurality of control signals; and
   an interface dependent circuit coupled to the mode register setting circuit for receiving the plurality of interface enable signals and operating in a selected interface mode responsive to the plurality of interface enable signals, whereby the semiconductor device is compatible with a plurality of system level interfaces;
   wherein:
   the plurality of control signals includes a row address strobe signal, a column address strobe signal, a write enable signal, and chip selection signal; and
   the mode register setting circuit activates one of the plurality of interface enable signals when the control signals are all active.

9. A semiconductor device comprising:

a mode register setting circuit for activating one of a plurality of interface enable signals responsive to an input address and a plurality of control signals; and an interface dependent circuit coupled to the mode register setting circuit for receiving the plurality of interface enable signals and operating in a selected interface mode responsive to the plurality of interface enable signals, whereby the semiconductor device is compatible with a plurality of system level interfaces;

wherein the mode register setting circuit comprises:

a mode register for receiving and storing a row address signal and generating a mode row address signal responsive to an interface selection mode signal; and an interface enable signal generator coupled to the mode register for receiving and decoding the mode row address signal and activating one of the plurality of interface enable signals responsive to the mode row address signal.

10. The semiconductor device of claim 9 wherein the mode register comprises:

a first inverter for inverting the row address signal;

a transmission gate coupled to the first inverter for transmitting the output from the first inverter responsive to the interface selection mode signal;

a latch coupled to the transmission gate for latching the signal from the transmission gate;

a precharge circuit coupled to the latch for precharging an input port of the latch; and a drive circuit coupled to the latch for driving the output from the latch, thereby generating the mode row address signal.

11. The semiconductor device of claim 10 wherein the precharge circuit is coupled between a power port and the input port of the latch, and includes a transistor that is gated by a signal that is activated before the interface selection mode signal is active and deactivated when the interface selection mode signal is active.

12. A semiconductor device compatible with a first interface, the device comprising:

an input buffer;

a reference voltage generator;

a pad for receiving a reference voltage;

a control circuit for generating an interface enable signal;

an interface dependent circuit coupled to the control circuit for operating with a second interface responsive to the interface enable signal;

a first switch coupled between the reference voltage generator and the input buffer for transmitting the reference voltage from the reference voltage generator to the input buffer responsive to the interface enable signal; and a second switch coupled between the pad and the input buffer for transmitting the reference voltage from the pad to the input buffer responsive to the interface enable signal;

whereby the semiconductor device can be configured to be compatible with the first and second interfaces responsive to interface selection information.

13. The semiconductor device of claim 12 wherein the control circuit includes:

an interface control circuit for activating an interface control signal when an interface selection mode is set; and an enable circuit coupled to the interface control circuit for generating an interface enable signal responsive to the interface control signal.

14. The semiconductor device of claim 13 wherein the interface control circuit comprises:

an interface selection signal generator for generating an interface selection signal that is active when a predetermined number of control signals for controlling the operation of the semiconductor device are active;

an interface mode signal generator for generating an interface mode signal responsive to a combination of row address signals; and an interface control signal generator coupled to the interface selection signal generator and the interface mode signal generator for generating the interface control signal responsive to the interface selection signal and the interface mode signal.

15. The semiconductor device of claim 14 wherein the interface selection signal generator activates the interface selection signal when a row address strobe signal, a column address strobe signal, a write enable signal, and a chip selection signal are all active.

16. The semiconductor device of claim 13 wherein the enable circuit comprises:

an inverter for inverting a row address signal;

a transmission gate coupled to the invertor for transmitting the output from the inverter responsive to the interface control signal;

a latch coupled to the transmission gate for latching the signal from the transmission gate;

a precharge circuit coupled to the latch for precharging an input port of the latch; and a drive circuit coupled to the latch for driving the output from the latch, thereby generating the interface enable signal.

17. The semiconductor device of claim 16 wherein the precharge circuit is coupled between a power port and the input port of the latch, and includes a transistor that is gated by a signal that is activated before the interface selection mode signal is active and deactivated when the interface selection mode signal is active.

18. The semiconductor device of claim 12 wherein the first switch is a transmission gate which is deactivated when the interface enable signal is active such that the transmission gate does not transmit the reference voltage from the reference voltage generator to the input buffer.

19. The semiconductor device of claim 12 wherein second switch is a transmission gate which is enabled when the interface enable signal is active so as to transmit the reference voltage from the pad to the input buffer.

20. A semiconductor device compatible with a first interface, the device comprising:

an input buffer;

a reference voltage generator;

a pad for receiving a reference voltage;

a mode register setting circuit for activating an interface enable signal responsive to an input address and a plurality of control signals;

an interface dependent circuit coupled to the mode register setting circuit for operating with a second interface responsive to the interface enable signal;

a first switch coupled between the reference voltage generator and the input buffer for transmitting the reference voltage from the reference voltage generator to the input buffer responsive to the interface enable signal; and a second switch coupled between the pad and the input buffer for transmitting the reference voltage from the pad to the input buffer responsive to the interface enable signal;

whereby the semiconductor device can be configured to be compatible with the first and second interfaces responsive to interface selection information.

21. The semiconductor device of claim 20 wherein the mode register setting circuit comprises:

a mode register for receiving and storing row address signal and generating a mode row address signal responsive to an interface selection mode signal; and an enable signal generator coupled to the mode register for receiving and decoding the mode row address signal and activating a corresponding interface enable signal responsive to the mode row address signal.

22. The semiconductor device of claim 21 wherein the mode register comprises:

a first inverter for inverting the row address signal;

a transmission gate coupled to the first inverter for transmitting the output from the first inverter responsive to the interface selection mode signal;

a latch coupled to the transmission gate for latching the signal from the transmission gate;

a precharge circuit coupled to the latch for precharging an input port of the latch; and a drive circuit coupled to the latch for driving the output from the latch, thereby generating the mode row address signal.

23. The semiconductor device of claim 22 wherein the precharge circuit is coupled between a power port and the input port of the latch, and includes a transistor that is gated by a signal that is activated before the interface selection mode signal is active and deactivated when the interface selection mode signal is active.

24. The semiconductor device of claim 20 wherein the first switch is a transmission gate which is deactivated when the interface enable signal is active such that the transmission gate does not transmit the reference voltage from the reference voltage generator to the input buffer.

25. The semiconductor device of claim 20 wherein the second switch is a transmission gate which is enabled when the interface enable signal is active so as to transmit the reference voltage from the pad to the input buffer.

26. A method for driving a semiconductor device that is compatible with a plurality of interfaces, the method comprising:

(a) setting the device in an interface selection mode;

(b) activating one of a plurality of interface enable signals responsive to an interface selection mode signal and an address signal; and (c) setting the operation of an interface dependent circuit responsive to the active interface enable signal such that the interface dependent circuit operates with a selected interface.

27. A method for driving a semiconductor device that is compatible with a plurality of interfaces, the method comprising:

(a) activating a mode register setting circuit responsive to a plurality of control signals;

(b) inputting a row address to the mode register setting circuit when the mode register setting circuit is activated;

(c) setting an interface selection mode according to the row address;

(d) activating one of a plurality of interface enable signals responsive to the row address; and (e) setting the operation of an interface dependent circuit responsive to the active interface enable signal such that the interface dependent circuit operates with a selected interface.

28. A method for driving a semiconductor device that is compatible with a plurality of interfaces, the method comprising:

(a) setting the device in an interface selection mode;

(b) generating an interface enable signal;

(c) setting the operation of an interface dependent circuit responsive to the interface enable signal such that the interface dependent circuit operates with a selected interface;

(d) isolating a reference voltage generated inside the device from an input buffer; and (e) applying a reference voltage from outside of the device to the input buffer.

29. A method for driving a semiconductor device that is compatible with a plurality of interfaces, the method comprising:

(a) enabling a mode register setting circuit responsive to a plurality of control signals;

(b) inputting a row address when the mode register setting circuit is activated;

(c) setting an interface selection mode responsive to the row address;

(d) generating an interface enable signal responsive to the row address;

(e) setting the operation of an interface dependent circuit responsive to the interface enable signal such that the interface dependent circuit operates with a selected interface;

(f) isolating a reference voltage generated inside the device from an input buffer; and (g) applying a reference voltage from outside of the device to the input buffer.

* * * * *

UNITED STATES PATENT AND TRADEMARK OFFICE
CERTIFICATE OF CORRECTION

PATENT NO.   : 6,087,851
DATED        : July 11, 2000
INVENTOR(S)  : Kim et al.

It is certified that error appears in the above-identified patent and that said Letters Patent is hereby corrected as shown below:

Column 1,
Line 67, ""thigh" logic level" should read -- "high" logic level --.

Column 2,
Line 10, "to block" should read -- top block --.

Column 7,
Line 63, "he CAS latency" should read -- the CAS latency --.
Line 64, "lurality" should read -- plurality --.

Column 12,
Line 3, "CAB" should read -- CSB --.

Column 14,
Line 36, "for coupled to " should read -- coupled to --.

Column 16,
Line 26, "invertor" should read -- inverter --.

Signed and Sealed this

Sixteenth Day of April, 2002

Attest:

JAMES E. ROGAN
*Attesting Officer*   *Director of the United States Patent and Trademark Office*